United States Patent
Huang et al.

(10) Patent No.: US 10,763,148 B2
(45) Date of Patent: Sep. 1, 2020

(54) SEMICONDUCTOR DEFECTS INSPECTION APPARATUS

(71) Applicant: UTECHZONE CO., LTD., New Taipei (TW)

(72) Inventors: Chien-Wen Huang, New Taipei (TW); Po-Tsung Lin, New Taipei (TW); Chih-Heng Fang, New Taipei (TW)

(73) Assignee: UTECHZONE CO., LTD., New Taipei (TW)

(*) Notice: Subject to any disclaimer, the term of this patent is extended or adjusted under 35 U.S.C. 154(b) by 0 days.

(21) Appl. No.: 16/420,188

(22) Filed: May 23, 2019

(65) Prior Publication Data

US 2020/0043765 A1 Feb. 6, 2020

(30) Foreign Application Priority Data

Jul. 31, 2018 (TW) .............................. 107126453 A

(51) Int. Cl.
| | |
|---|---|
| *H01L 21/67* | (2006.01) |
| *G02B 21/36* | (2006.01) |
| *G02B 21/06* | (2006.01) |
| *H04N 5/33* | (2006.01) |
| *H04N 5/225* | (2006.01) |
| *G02B 27/48* | (2006.01) |
| *G01N 21/95* | (2006.01) |

(52) U.S. Cl.
CPC ........ *H01L 21/67288* (2013.01); *G02B 21/06* (2013.01); *G02B 21/365* (2013.01); *H04N 5/2254* (2013.01); *H04N 5/2256* (2013.01); *H04N 5/33* (2013.01); *G02B 27/48* (2013.01)

(58) Field of Classification Search
CPC . H01L 21/67288; G02B 21/06; G02B 21/365; G02B 27/48; H04N 5/2254; H04N 5/2256; H04N 5/33; G01B 2210/56; G01N 21/9501; G01N 21/9503; G01N 21/9505; G01N 2021/8461
See application file for complete search history.

(56) References Cited

U.S. PATENT DOCUMENTS

| | | | | |
|---|---|---|---|---|
| 8,169,613 | B1* | 5/2012 | Biellak | G01J 1/0422 |
| | | | | 356/237.2 |
| 9,553,034 | B1* | 1/2017 | Young | H01L 22/24 |
| 2010/0165095 | A1* | 7/2010 | Nakamura | G01N 21/9501 |
| | | | | 348/92 |
| 2011/0090507 | A1* | 4/2011 | Park | G01N 21/88 |
| | | | | 356/445 |

(Continued)

*Primary Examiner* — Alexander Gee
(74) *Attorney, Agent, or Firm* — JCIPRNET

(57) ABSTRACT

A semiconductor defects inspection apparatus for inspection of bubble defects of an object is provided. The semiconductor defects inspection apparatus includes a carrier, an optical system, an infrared image capturing device, and a processing unit. The carrier is adapted for bearing the object. The optical system provides an illumination beam to the object to produce an image beam. The infrared image capturing device is disposed on a transmission path of the image beam. The infrared image capturing device is adapted for receiving the image beam to be transformed into an image information. The processing unit is electrically connected to the infrared image capturing device and adapted for analyzing the object according to the image information.

20 Claims, 4 Drawing Sheets

(56) References Cited

U.S. PATENT DOCUMENTS

| | | | |
|---|---|---|---|
| 2011/0216312 A1* | 9/2011 | Matsumoto | G01N 21/9501 356/237.1 |
| 2012/0044279 A1* | 2/2012 | Uchino | H04N 9/3129 345/690 |
| 2013/0162980 A1* | 6/2013 | Kim | G01N 21/9501 356/51 |
| 2014/0233024 A1* | 8/2014 | Taniguchi | G01N 21/9501 356/237.5 |
| 2016/0116822 A1* | 4/2016 | Kaneda | H01S 3/109 372/6 |
| 2017/0061603 A1* | 3/2017 | Agashe | G02B 26/06 |
| 2017/0370856 A1* | 12/2017 | Takeda | H01L 22/12 |

* cited by examiner

SEMICONDUCTOR DEFECTS INSPECTION APPARATUS

CROSS-REFERENCE TO RELATED APPLICATION

This application claims the priority benefit of Taiwan application serial no. 107126453, filed on Jul. 31, 2018. The entirety of the above-mentioned patent application is hereby incorporated by reference herein and made a part of this specification.

BACKGROUND

Technical Field

The disclosure relates to an inspection apparatus, and more particularly to a semiconductor defects inspection apparatus.

Description of Related Art

With the development of technology, people are increasingly demanding regarding precision and quality of electronic components in electronic products. For example, quality and visual inspection of various elements on a circuit board in an electronic product is an important step during manufacturing and inspection processes to ensure proper functioning of the circuit board. Currently, inspection of the inner layer of a silicon wafer using an area-scan camera is the most common. However, how to design or modify existing inspection apparatus and technical solutions to increase the scanning speed, thereby optimizing the inspection procedure so as to improve silicon wafer production requires a collaborative research effort of persons skilled in the art.

SUMMARY

The disclosure provides a semiconductor defects inspection apparatus capable of improving the optical quality and the inspection effect of the semiconductor defects inspection apparatus.

The disclosure provides a semiconductor defects inspection apparatus, for inspecting bubble defects of an object under inspection, including a carrier, an optical system, an infrared image capturing device, and a processing unit. The carrier is adapted for bearing the object under inspection. The optical system provides an illumination beam to the object under inspection to produce an image beam. The infrared image capturing device is disposed on the transmission path of the image beam. The infrared image capturing device is adapted for receiving the image beam to be transformed into an image information. The processing unit is electrically connected to the infrared image capturing device and is adapted for analyzing the object under inspection according to the image information.

Based on the above, the semiconductor defects inspection apparatus of the disclosure is capable of improving the inspection effect of the semiconductor defects inspection apparatus and effectively increasing capacity of product.

To make the aforementioned and other features of the disclosure more comprehensible, several embodiments accompanied with drawings are described in detail as follows.

DESCRIPTION OF THE EMBODIMENTS

Figure 1:
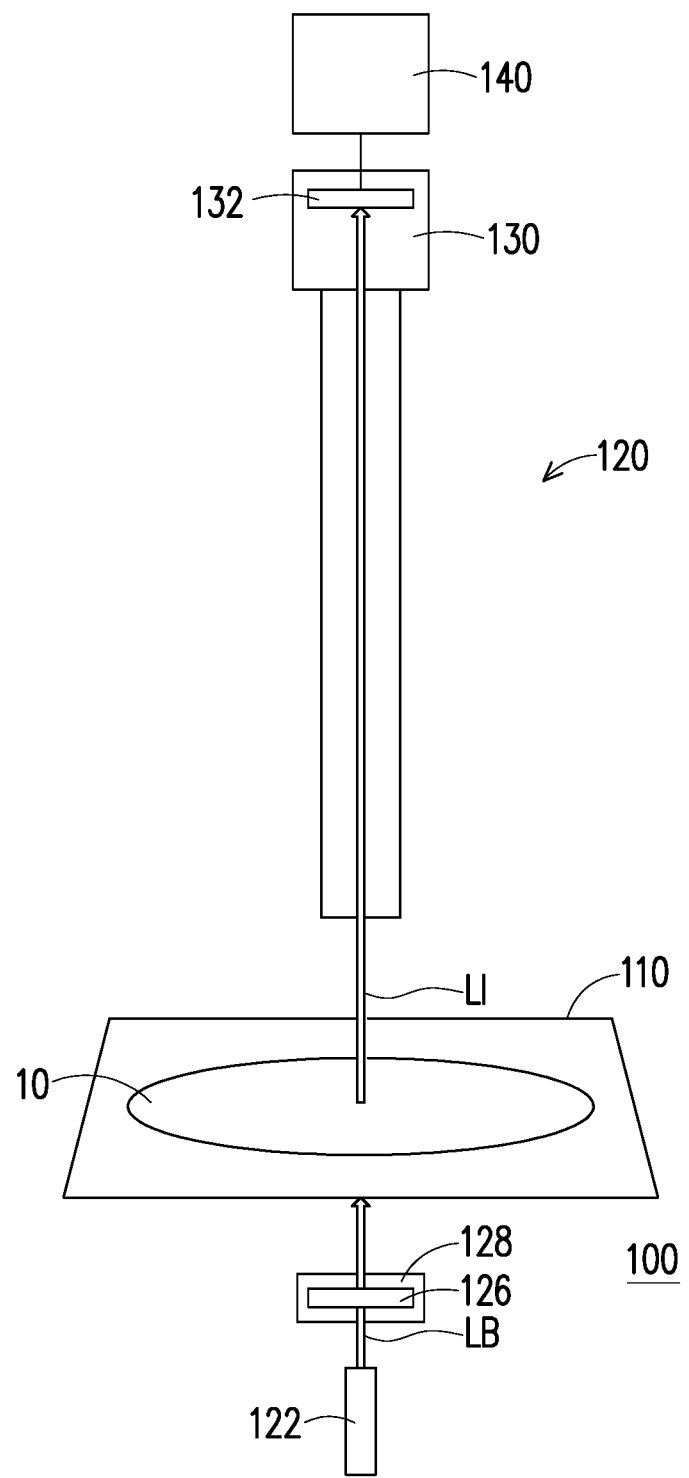
FIG. 1 is a schematic view of a semiconductor defects inspection apparatus according to an embodiment of the disclosure.

FIG. 1 is a schematic view of a semiconductor defects inspection apparatus according to an embodiment of the disclosure. Please refer to FIG. 1, in the embodiment, a semiconductor defects inspection apparatus 100 includes a carrier 110, an optical system 120, an infrared image capturing device 130, and a processing unit 140. The carrier 110 is adapted for bearing an object 10 under inspection. In the embodiment, the object 10 under inspection includes, but is not limited to, a semiconductor substrate, a semiconductor wafer, a semiconductor package chip, or a similar semiconductor object. Specifically, the inspection items of the semiconductor defects inspection apparatus 100 of the embodiment includes, but is not limited to, bubble defects of the inner layer of the object 10 under inspection, thereby improving manufacturing means of the object 10 under inspection to increase production capacity. However, the disclosure is not limited to such.

The optical system 120 is adapted for providing an illumination beam LB to the object 10 under inspection and producing an image beam LI as well as receiving and transmitting the image beam LI to the infrared image capturing device 130 for subsequent arithmetic processing. The optical system 120 includes a light source 122. Specifically, the optical system 120 is, for example, an optical lens or an optical device with a focusing lens, a reflective mirror, or a combination of other optical elements. In some embodiments, the illumination beam LB is a visible light, but in some embodiments, the illumination beam LB may be a near-infrared light or a short-wavelength infrared light. The disclosure is not limited to such.

The light source 122 is adapted for providing the illumination beam LB to the object 10 under inspection to produce the image beam LI. Specifically, in the embodiment, the light source 122 is a halogen lamp. However, in other embodiments to be illustrated later, the illumination beam LB may be an infrared laser light, but the disclosure is not limited to such.

The infrared image capturing device 130 is disposed on the transmission path of the image beam LI and is adapted for receiving the image beam LI to transform the optical image of the image beam LI into an electronic signal. Specifically, the infrared image capturing device 130 includes a photosensitive element 132 for receiving the image beam LI to be transformed into an image information. The photosensitive element 132 is, for example, a charge-coupled device (CCD). In the embodiment, the infrared image capturing device 130 is an area-scan camera, and thus being able to control the movement of the carrier 110 to shoot the object 10 under inspection. In some embodiments, the infrared image capturing device 130 may be provided with a combination of one or more optical lenses having refractive power depending on needs, for example, including various combinations of non-planar lenses such as biconcave lenses, biconvex lenses, concave-convex lenses, convex-concave lenses, plano-convex lenses, plano-concave lenses, etc., thereby assisting in guiding the image beam L1. However, the disclosure is not limited to such. In the embodiment, the degree that the object 10 under inspection absorbs various wavelengths in the illumination beam LB is mainly based on visible light and infrared light, and the object 10 under inspection has a good light absorption efficiency for a wavelength of about 400 nm to 900 nm.

Please continue referring to FIG. 1. The processing unit 140 is electrically connected to the infrared image capturing device 130 and is adapted for executing analyses according to the electronic signals received. Specifically, the processing unit 140 is electrically connected to the photosensitive element 132 and analyzes the object 10 under inspection according to the image information described above. The processing unit 140 is, for example, a central processing unit (CPU), or other programmable general-purpose or specific-purpose microprocessor, a digital signal processor (DSP), a programmable controller, an application specific integrated circuit (ASIC), other similar elements, or a combination of the above elements. The disclosure is not limited to such.

In the embodiment, the optical system 120 further includes a polarizer 126 disposed between the light source 122 and the carrier 110. The polarizer 126 is, for example, a linear polarizer allowing the illumination beam LB emitted by the light source 122 to pass through the polarizer 126 to produce a linearly polarized illumination beam LB. In some embodiments, the polarizer 126 may also be, for example, a circular polarizing sheet or an oval polarizing sheet. The disclosure is not limited to such. Therefore, the infrared image capturing device 130 is able to capture optical images corresponding to different depth positions of the object 10 under inspection. In other words, the linearly polarized illumination beam LB from different directions has different illumination depth positions on the object 10 under inspection. Therefore, the infrared image capturing device 130 is able to obtain optical images of different depth positions by adjusting the polarizing angle of the polarizer 126. As such, the polarizer 126 may be further configured and adjusted according to the material and the property of the object 10 under inspection or different levels of demand to improve the display effect of the optical image.

In the embodiment, the optical system 120 further includes an adjustment mechanism 128, disposed between the light source 122 and the carrier 110, and is adapted for adjusting the polarizing angle of the polarizer 126. For example, the adjustment mechanism 128 is, for example, an automatic mechanism capable of controlling the polarizer 126. The mechanism 128 can rotate to a specific angle according to a specific circuit signal as given, thereby driving the polarizer 126 to rotate so as to adjust the polarizing state of the illumination beam LB. For example, the adjustment mechanism 128 may be set in advance to further control the polarizer 126 to rotate, for example, by 5 degrees, and allows the infrared image capturing device 130 to capture an image automatically. However, in other embodiments, the adjustment mechanism 128 may also execute an adjustment through manual rotation. The disclosure provides no limitation to the type of adjustment mechanism 128 and the manner in which the adjustment is executed.

In other words, the optical system 120 of the embodiment is a transmissive optical system. In other embodiments, however, the embodiment of FIG. 1 may also adopt a reflective optical system (such as the optical system 120A of FIG. 4) depending on needs. However, the disclosure is not limited to such.

Figure 2:
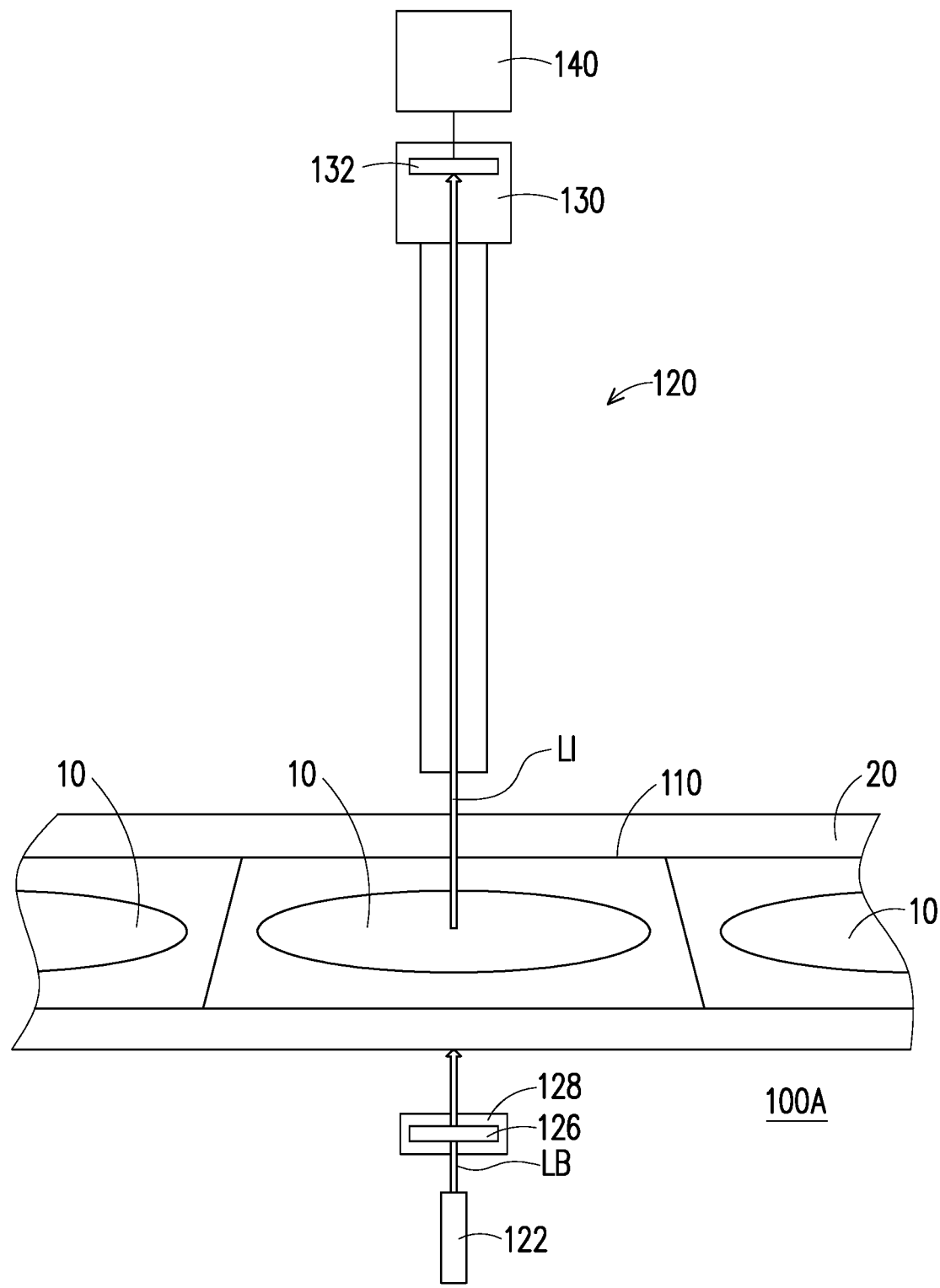
FIG. 2 is a schematic view of a semiconductor defects inspection apparatus according to another embodiment of the disclosure.

FIG. 2 is a schematic view of a semiconductor defects inspection apparatus according to another embodiment of the disclosure. Please refer to FIG. 2. A semiconductor defects inspection apparatus 100A of the embodiment is similar to the semiconductor defects inspection apparatus 100 of FIG. 1. The difference between the two is that, in this embodiment, the light source 122 of the semiconductor defects inspection apparatus 100A is a light emitting device capable of providing a laser light, such as a device using a speckle reduction laser. Therefore, the illumination beam LB is a laser light. In the embodiment, however, the illumination beam LB is, for example, an infrared light with a center wavelength of approximately 1250 nm to 1350 nm.

In addition, since the power density of a laser light is as high as up to several times to several hundred times the power density of general light emitting diodes, the infrared image capturing device 130 of the embodiment may use a high-speed linear scan camera. Therefore, an additional transporting apparatus 20 may be used to transport the carrier 110 to linear-shoot the object 10 under inspection. In this manner, the illumination power density may be increased to improve the optical quality and the inspection effect of the semiconductor defects inspection apparatus 100A and decrease the cost of the optical system 120. In the embodiment, the object 10 under inspection has a higher degree of absorption for the illumination beam LB with a wavelength of approximately 1300 nm, allowing the image to be clear. Therefore, a better inspection performance may be exhibited, thereby improving the optical quality and the inspection effect of the optical inspection apparatus 100A.

Figure 3:
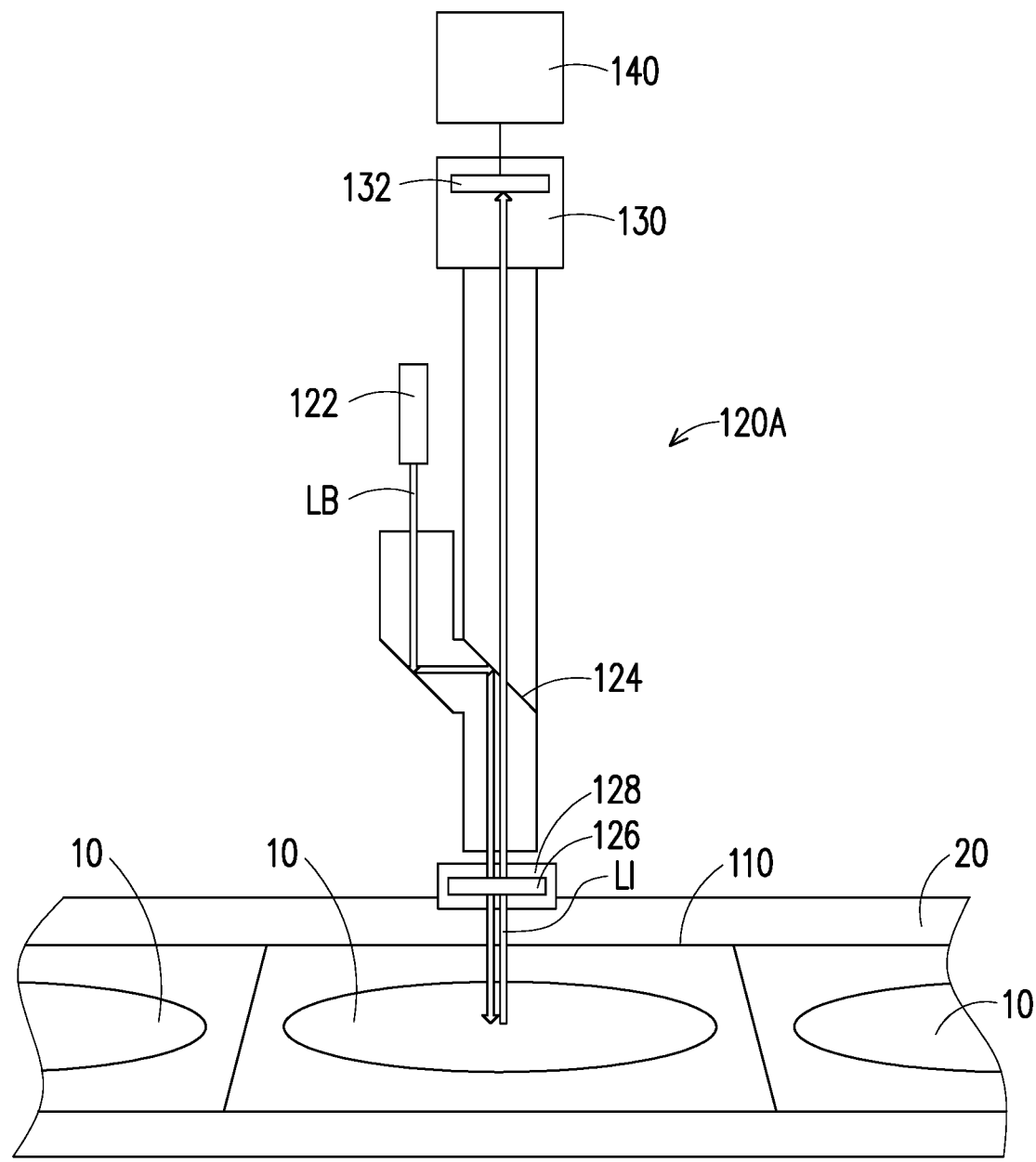
FIG. 3 is a schematic view of a semiconductor defects inspection apparatus according to yet another embodiment of the disclosure.

FIG. 3 is a schematic view of a semiconductor defects inspection apparatus according to yet another embodiment of the disclosure. Please refer to FIG. 3. A semiconductor defects inspection apparatus 100B of the embodiment is similar to the semiconductor defects inspection apparatus 100A of FIG. 2. The difference between the two is that, in this embodiment, an optical system 120A of the semiconductor defects inspection apparatus 100B is a reflective optical system. Specifically, the optical system 120 further includes a light splitting element 124 disposed on the transmission path of the illumination beam LB and the image beam LI, such as a dichroic mirror adapted for reflecting the illumination beam LB and allowing the image beam LI to pass through. Moreover, in some embodiments, the optical system 120A may selectively include a reflective element for guiding the illumination beam LB emitted by the light source 122 to the object 10 under inspection. However, the disclosure is not limited to such. In other embodiments, other types of optical elements may be used to guide the illumination beam LB to the object 10 under inspection. Furthermore, the light source 122 of the semiconductor defects inspection apparatus 100B is a light emitting device capable of providing a laser light with a center wavelength of approximately 1500 nm to 1600 nm. In this manner, the illumination power density may be increased to improve the optical quality and the inspection effect of the semiconductor defects inspection apparatus 100 and decrease the cost of the optical system 120A. In the embodiment, the object 10 under inspection has a higher degree of absorption for the illumination beam LB with a wavelength of approximately 1550 nm, allowing the image beam to be clear. Thus, a better inspection performance can be exhibited, thereby improving the optical quality and the inspection effect of the optical inspection apparatus 100B.

Figure 4:
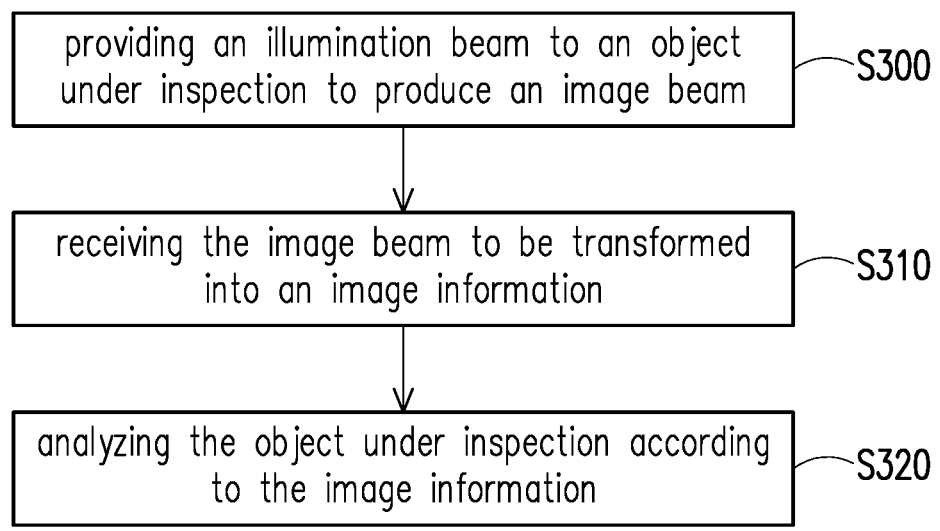
FIG. 4 is a flowchart of an inspection method for semiconductor wafer defects according to an embodiment of the disclosure.

FIG. 4 is a flowchart of an inspection method for semiconductor wafer defects according to an embodiment of the disclosure. Please refer to FIG. 3 and FIG. 4. The inspection method of the embodiment is at least applicable to the semiconductor defects inspection apparatus 100B shown in FIG. 3. Therefore, the illustration below is exemplified using the semiconductor defects inspection apparatus 100B of FIG. 3, but the disclosure is not limited to such. In the inspection method of the embodiment, first, a step S300 is executed to provide the illumination beam LB to the object 10 under inspection to produce the image beam LI. Specifically, the illumination beam LB may be provided by the light source 122 of the semiconductor defects inspection apparatus 100B, such that the object 10 under inspection is illuminated to reflect the image beam LI capable of reactively displaying the structure of the object 10 under inspection.

Next, after the step S300 above is executed, a step S310 is executed to receive the image beam LI1 to be transformed into an image information. Specifically, the image beam LI1 may be received by the infrared image capturing device 130 of the semiconductor defects inspection apparatus 100B, thereby producing the image information which is provided to the processing unit 140 for recognition or inspection. Next, after the step S310 above is executed, a step S320 is executed to analyze the object 10 under inspection according to the image information. Specifically, the object 10 under inspection may be analyzed through comparing and arithmetic processing of the image data in the processing unit 140 to produce an inspection result. As such, the optical quality and the inspection effect of the semiconductor defects inspection apparatus 100B may be improved, thereby improving manufacturing means of the object 10 under inspection to increase production capacity.

In other embodiments, the method of providing the illumination beam LB to the object 10 under inspection to produce the image beam LI further includes the steps of providing the illumination beam LB to the polarizer 126 and adjusting the polarizing angle of the polarizer 126 so as to adjust the polarizing state of the illumination beam LB. As such, different optical images can be further obtained according to different polarizing states or polarizing directions of the illumination beam LB, thereby improving the display effect of the optical image of the semiconductor defects inspection apparatus 100B and the inspection effect of the object 10 under inspection.

Based on the above, the semiconductor defects inspection apparatus of the disclosure may improve the optical quality and the inspection effect of the semiconductor defects inspection apparatus, thereby improving manufacturing means of the object under inspection to increase production capacity.

Although the disclosure has been disclosed in the above embodiments, the embodiments are not intended to limit the disclosure. It will be apparent to persons skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor defects inspection apparatus for inspecting bubble defects of an object under inspection, comprising:
   a carrier, adapted for bearing the object under inspection;
   an optical system, providing an illumination beam to the object under inspection to produce an image beam;
   an infrared image capturing device, disposed on a transmission path of the image beam, adapted for receiving the image beam to be transformed into an image information; and
   a processing unit, electrically connected to the infrared image capturing device, adapted for analyzing the object under inspection according to the image information, wherein a center wavelength of the illumination beam is between 1250 nm and 1350 nm.

2. The semiconductor defects inspection apparatus according to claim 1, wherein the optical system comprises a light source adapted for providing the illumination beam to the object under inspection to produce the image beam.

3. The semiconductor defects inspection apparatus according to claim 2, wherein the light source is a halogen lamp.

4. The semiconductor defects inspection apparatus according to claim 1, wherein the optical system comprises a light splitting element, disposed on a transmission path of the illumination beam and the image beam, adapted for reflecting the illumination beam and allowing the image beam to pass through.

5. The semiconductor defects inspection apparatus according to claim 1, wherein the optical system is a transmissive optical system.

6. The semiconductor defects inspection apparatus according to claim 1, wherein the optical system is a reflective optical system.

7. The semiconductor defects inspection apparatus according to claim 1, wherein the illumination beam is a near-infrared light or a short-wavelength infrared light.

8. The semiconductor defects inspection apparatus according to claim 1, wherein the illumination beam is an infrared laser beam, a halogen lamp, or an infrared light emitting diode device.

9. The semiconductor defects inspection apparatus according to claim 2, wherein the light source is a speckle reduction laser device.

10. The semiconductor defects inspection apparatus according to claim 1, wherein the infrared image capturing device is a high-speed linear scan camera or an area-scan camera.

11. The semiconductor defects inspection apparatus according to claim 2, wherein the polarizer is disposed between the light source and the carrier.

12. The semiconductor defects inspection apparatus according to claim 11, wherein the polarizer is a linear polarizing sheet or a circular polarizing sheet.

13. The semiconductor defects inspection apparatus according to claim 11, wherein the optical system further comprises an adjustment mechanism, disposed between the light source and the carrier, adapted for adjusting a polarizing angle of the polarizer.

14. The semiconductor defects inspection apparatus according to claim 1, wherein the object under inspection is a semiconductor substrate, a semiconductor wafer, a semiconductor package chip, or a similar semiconductor object.

15. The semiconductor defects inspection apparatus according to claim 1, wherein the semiconductor defects inspection apparatus is adapted for inspecting bubble defects of an inner layer of the object under inspection.

16. A semiconductor defects inspection apparatus for inspecting bubble defects of an object under inspection, comprising:
- a carrier, adapted for bearing the object under inspection;
- an optical system, providing an illumination beam to the object under inspection to produce an image beam;
- an infrared image capturing device, disposed on a transmission path of the image beam, adapted for receiving the image beam to be transformed into an image information; and
- a processing unit, electrically connected to the infrared image capturing device, adapted for analyzing the object under inspection according to the image information,
- wherein a center wavelength of the illumination beam is between 1500 nm and 1600 nm.

17. The semiconductor defects inspection apparatus according to claim 16, wherein the optical system further comprises a polarizer that is disposed between the light source and the carrier.

18. The semiconductor defects inspection apparatus according to claim 17, wherein the polarizer is a linear polarizing sheet or a circular polarizing sheet.

19. The semiconductor defects inspection apparatus according to claim 17, wherein the optical system further comprises an adjustment mechanism, disposed between the light source and the carrier, adapted for adjusting a polarizing angle of the polarizer.

20. The semiconductor defects inspection apparatus according to claim 16, wherein the semiconductor defects inspection apparatus is adapted for inspecting bubble defects of an inner layer of the object under inspection.

\* \* \* \* \*